US010429255B2

United States Patent
Genmei et al.

(10) Patent No.: US 10,429,255 B2
(45) Date of Patent: Oct. 1, 2019

(54) PIEZOELECTRIC SENSOR AND DETECTING DEVICE

(71) Applicant: Murata Manufacturing Co., Ltd., Nagaokakyo-shi, Kyoto-fu (JP)

(72) Inventors: Yuya Genmei, Nagaokakyo (JP); Jiro Inoue, Nagaokakyo (JP); Masayuki Ichimaru, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 359 days.

(21) Appl. No.: 15/433,158

(22) Filed: Feb. 15, 2017

(65) Prior Publication Data

US 2017/0160147 A1   Jun. 8, 2017

Related U.S. Application Data

(63) Continuation of application No. PCT/JP2015/059927, filed on Mar. 30, 2015.

(30) Foreign Application Priority Data

Aug. 22, 2014   (JP) .................................. 2014-169238

(51) Int. Cl.
*G01L 1/00* (2006.01)
*G01L 1/16* (2006.01)
(Continued)

(52) U.S. Cl.
CPC ............... *G01L 1/162* (2013.01); *G01B 7/16* (2013.01); *G01B 7/22* (2013.01); *H01L 41/042* (2013.01);
(Continued)

(58) Field of Classification Search
CPC .. G01L 1/162; G01B 7/16; G01B 7/22; H01L 41/042; H01L 41/047; H01L 41/0533; H01L 41/1132
(Continued)

(56) References Cited

U.S. PATENT DOCUMENTS 4,912,351 A * 3/1990 Takata ................. H02N 2/0025
                                                    310/323.16
5,049,079 A * 9/1991 Furtado .................. A63B 69/18
                                                         434/253
(Continued)

FOREIGN PATENT DOCUMENTS

JP   46-027022 B   8/1971
JP   62-053364 U   4/1987
(Continued)

OTHER PUBLICATIONS

Official Communication issued in corresponding International Application PCT/JP2015/059927, dated Jun. 23, 2015.
(Continued)

*Primary Examiner* — Max H Noori
(74) *Attorney, Agent, or Firm* — Keating & Bennett, LLP

(57) ABSTRACT

A piezoelectric sensor is fixed to a detection object and detects distortion of the detection object includes first and second principal surfaces, and extends in the lengthwise direction. The piezoelectric sensor includes a piezoelectric body whose polarization axis extends in a direction parallel or substantially parallel to the lengthwise direction, and first and second detecting electrodes that are provided on a surface of the piezoelectric body and that extend in a direction parallel or substantially parallel to the lengthwise direction. Distortion of the detection object is detected based on electric output corresponding to shear stress of the piezoelectric body.

19 Claims, 9 Drawing Sheets

(51) Int. Cl.
- *G01B 7/16* (2006.01)
- *H01L 41/047* (2006.01)
- *H01L 41/04* (2006.01)
- *H01L 41/053* (2006.01)
- *H01L 41/113* (2006.01)

(52) U.S. Cl.
CPC ........ *H01L 41/047* (2013.01); *H01L 41/0533* (2013.01); *H01L 41/1132* (2013.01)

(58) Field of Classification Search
USPC .......................................................... 73/775
See application file for complete search history.

(56) References Cited

U.S. PATENT DOCUMENTS

| | | | |
|---|---|---|---|
| 5,166,910 A * | 11/1992 | Batzle | G01N 29/07 367/191 |
| 5,824,904 A | 10/1998 | Kouhei et al. | |
| 7,073,884 B2 * | 7/2006 | Ueda | B41J 2/14024 347/108 |
| 8,640,550 B2 * | 2/2014 | Nishiwaki | B66C 1/445 73/777 |
| 2006/0028095 A1 | 2/2006 | Maruyama et al. | |
| 2008/0225363 A1 * | 9/2008 | Saitoh | G02B 26/0858 359/199.1 |

FOREIGN PATENT DOCUMENTS

| | | |
|---|---|---|
| JP | 62-081572 A | 4/1987 |
| JP | 62-156503 A | 7/1987 |
| JP | 07-253441 A | 10/1995 |
| JP | 09-055638 A | 2/1997 |
| JP | 11-307835 A | 11/1999 |
| JP | 2001-066317 A | 3/2001 |
| JP | 2002-162408 A | 6/2002 |
| JP | 2006-048302 A | 2/2006 |
| JP | 2006-038710 A | 9/2006 |

OTHER PUBLICATIONS

Official Communication issued in Japanese Patent Application No. 2016-543831, dated Feb. 6, 2018.

\* cited by examiner

PIEZOELECTRIC SENSOR AND DETECTING DEVICE

CROSS REFERENCE TO RELATED APPLICATIONS

This application claims the benefit of priority to Japanese Patent Application No. 2014-169238 filed on Aug. 22, 2014 and is a Continuation Application of PCT Application No. PCT/JP2015/059927 filed on Mar. 30, 2015. The entire contents of each application are hereby incorporated herein by reference.

BACKGROUND OF THE INVENTION

1. Field of the Invention

The present invention relates to a piezoelectric sensor and a detecting device.

2. Description of the Related Art

An exemplary known piezoelectric sensor of the related art which detects bending is a piezoelectric sensor that is described in Japanese Unexamined Patent Application Publication No. 62-156503 described below and that uses the d31 mode.

The piezoelectric sensor described in Japanese Unexamined Patent Application Publication No. 62-156503 has a bimorph structure having a piezoelectric thin film in an upper layer and one in a lower layer. In detection of bending, output from the upper layer and output from the lower layer are measured, and, for example, the output from the upper layer is corrected. Then, the corrected output of the upper layer is added to the output from the lower layer. This enables charge on the upper layer and charge on the lower layer, which are produced due to the pyroelectric effect of the piezoelectric sensor, to cancel each other out.

However, the piezoelectric sensor described in Japanese Unexamined Patent Application Publication No. 62-156503 needs to include a measuring device that measures the output from the upper layer and the output from the lower layer, and a correction circuit that corrects the output from the upper layer or the output from the lower layer, resulting in deterioration in detection efficiency.

SUMMARY OF THE INVENTION

Preferred embodiments of the present invention provide piezoelectric sensors that enable distortion of a test object to be detected based on electric output corresponding to shear stress applied to a piezoelectric body.

A preferred embodiment of the present invention provides a piezoelectric sensor fixed to a detection object and detecting distortion of the detection object. The piezoelectric sensor includes a piezoelectric body and first and second detecting electrodes. The piezoelectric body includes first and second principal surfaces and extends in a lengthwise direction. The polarization axis direction of the piezoelectric body is parallel or substantially parallel to the lengthwise direction. The first and second detecting electrodes are provided on a surface of the piezoelectric body and extend in a direction parallel or substantially parallel to the lengthwise direction. The distortion of the detection object is detected based on electric output corresponding to shear stress applied to the piezoelectric body.

According to a first particular aspect of a piezoelectric sensor according to a preferred embodiment of the present invention, the piezoelectric sensor includes a third electrode that is not connected to outside. The third electrode is provided on the first principal surface of the piezoelectric body. The first and second detecting electrodes are provided on the second principal surface of the piezoelectric body so as to face each other with a gap interposed therebetween, and are provided with facing portions in which the first and second detecting electrodes face the third electrode in a thickness direction of the piezoelectric body.

According to a second particular aspect of a piezoelectric sensor according to a preferred embodiment of the present invention, the piezoelectric sensor includes first and second piezoelectric bodies defining the piezoelectric body. Each of the first and second piezoelectric bodies includes the first and second principal surfaces and extends in the lengthwise direction. The first and second detecting electrodes are provided on the second principal surface of each of the first and second piezoelectric bodies so as to face each other with the gap interposed therebetween. The third electrode is provided on the first principal surfaces of the first and second piezoelectric bodies. The first piezoelectric body is connected to the second piezoelectric body such that the first principal surfaces or the second principal surfaces are connected to each other. Polarization axis directions of the first and second piezoelectric bodies match the lengthwise direction and are opposite to each other.

According to a third particular aspect of a piezoelectric sensor according to a preferred embodiment of the present invention, the piezoelectric sensor includes third and fourth piezoelectric bodies defining the piezoelectric body. Each of the third and fourth piezoelectric bodies includes the first and second principal surfaces, extends in the lengthwise direction, and also includes first and second end surfaces that face each other in the lengthwise direction. The second end surface of the third piezoelectric body is connected to the first end surface of the fourth piezoelectric body. The first detecting electrode is provided on the first principal surfaces of the third and fourth piezoelectric bodies. The second detecting electrode is provided on the second principal surfaces of the third and fourth piezoelectric bodies. The piezoelectric sensor includes facing portions in which the first detecting electrode faces the second detecting electrode in a thickness direction of the third and fourth piezoelectric bodies. Polarization axis directions of the third and fourth piezoelectric bodies match the lengthwise direction and are opposite to each other.

According to a fourth particular aspect of a piezoelectric sensor according to a preferred embodiment of the present invention, a plate-shaped outer body is disposed on at least one of the first and second principal surfaces of the piezoelectric body.

According to a fifth particular aspect of a piezoelectric sensor according to a preferred embodiment of the present invention, the piezoelectric sensor further includes a mounting substrate connected to one of the first principal surface and the second principal surface of the piezoelectric body.

According to a sixth particular aspect of a piezoelectric sensor according to a preferred embodiment of the present invention, the piezoelectric sensor further includes a mounting substrate connected to the outer body.

Preferred embodiments of the present invention provide detecting devices including a sensor circuit that includes an operational amplifier including first and second input ends and an output end, and piezoelectric sensors with a unique structural configuration according to preferred embodiments of the present invention. The piezoelectric sensor is connected to the first input end of the operational amplifier.

Preferred embodiments of the present invention may provide a piezoelectric sensor that enables distortion of a test object to be detected based on electric output corresponding to shear stress applied to a piezoelectric body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
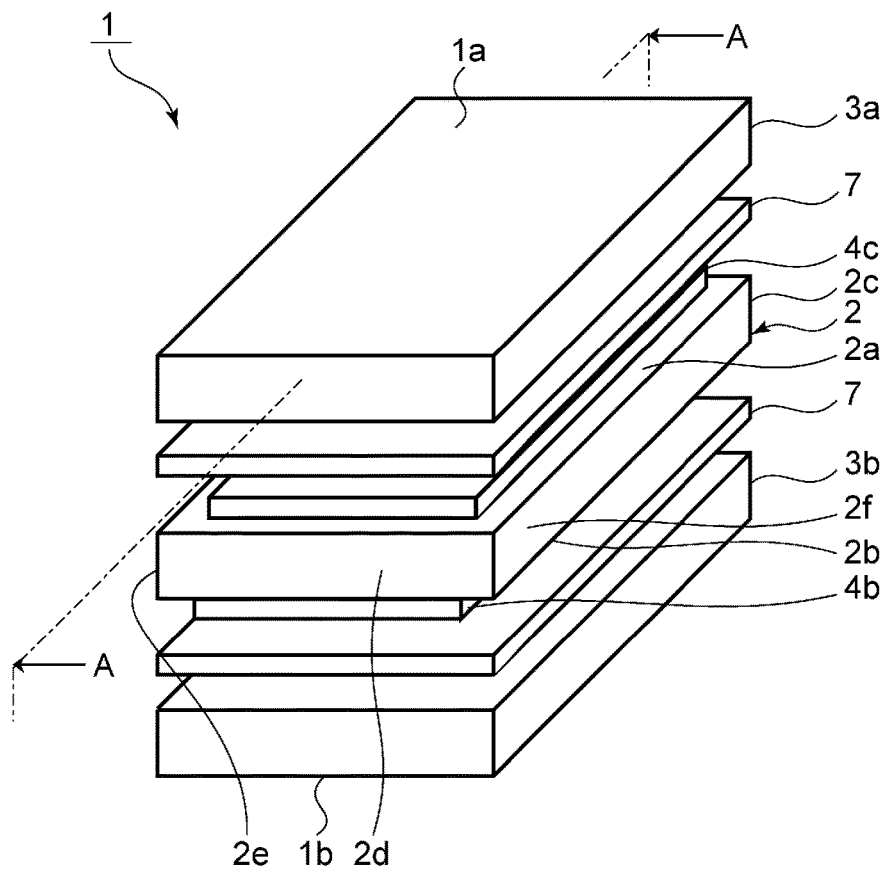
FIG. 1 is an exploded perspective view of a piezoelectric sensor according to a first preferred embodiment of the present invention.
Figure 2:
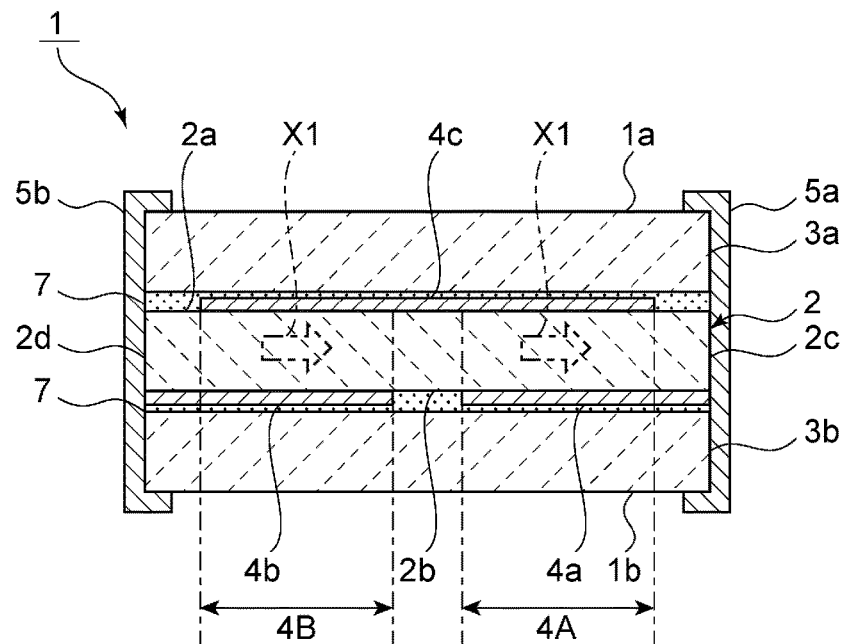
FIG. 2 is a front sectional view, which corresponds to a portion taken along line A-A in FIG. 1, of the piezoelectric sensor according to the first preferred embodiment of the present invention.

FIG. 1 is an exploded perspective view of a piezoelectric sensor according to a first preferred embodiment of the present invention. FIG. 2 is a sectional view, which corresponds to a portion taken along line A-A in FIG. 1, of the piezoelectric sensor according to the first preferred embodiment.

A piezoelectric sensor 1 includes a piezoelectric body 2 having a rectangular-plate shape. However, the piezoelectric body 2 does not need to have a rectangular-plate shape.

The piezoelectric body 2 which includes first and second principal surfaces 2a and 2b extends in the lengthwise direction. The piezoelectric body 2 is preferably made of a piezoelectric ceramic material, such as PZT, lead titanate, barium titanate, or potassium/sodium niobate, a piezoelectric single crystal, such as crystal, lithium tantalate, lithium niobate, langasite, or lead magnesium niobate/lead tantalate solid solution, or a piezoelectric polymer, such as polyvinylidene fluoride or polyvinylidene fluoride/polytrifluorochloroethylene copolymer.

The first principal surface 2a of the piezoelectric body 2 is fixed to a first outer body 3a having a plate shape, with an adhesive 7 interposed in between. The second principal surface 2b of the piezoelectric body 2 is fixed to a second outer body 3b having a plate shape, with an adhesive 7 interposed in between. The first and second outer bodies 3a and 3b are formed of an appropriate material, for example, an insulating ceramic material such as alumina or a synthetic resin. The adhesives 7 are formed of an appropriate insulating adhesive such as epoxy resin. The adhesives 7 do not need to be insulative.

As illustrated in FIG. 2, first and second detecting electrodes 4a and 4b are provided on the second principal surface 2b of the piezoelectric body 2. The first and second detecting electrodes 4a and 4b extend in the lengthwise direction of the piezoelectric body 2. The first detecting electrode 4a faces the second detecting electrode 4b with a gap interposed in between at the center in the lengthwise direction of the piezoelectric body 2. A third electrode 4c is provided on the first principal surface 2a of the piezoelectric body 2. The third electrode 4c which is a floating electrode is not connected to the outside. The first and second detecting electrodes 4a and 4b are provided with facing portions 4A and 4B in which the first and second detecting electrodes 4a and 4b face the third electrode 4c in the thickness direction of the piezoelectric body 2.

In the piezoelectric body 2, a direction that is perpendicular or substantially perpendicular to the lengthwise direction is referred to as a width direction. The piezoelectric body 2 includes first and second side surfaces 2e and 2f that face each other in the width direction. The first and second detecting electrodes 4a and 4b and the third electrode 4c do not reach the first and second side surfaces 2e and 2f, and are not exposed on the first and second side surfaces 2e and 2f. Thus, it is difficult for impurities to attach to the first and second detecting electrodes 4a and 4b and the third electrode 4c. Therefore, reduction in insulation resistance of the piezoelectric sensor 1 is significantly suppressed. The first and second detecting electrodes 4a and 4b and the third electrode 4c may be exposed on the first and second side surfaces 2e and 2f of the piezoelectric body 2.

The piezoelectric body 2 includes first and second end surfaces 2c and 2d that face each other in the lengthwise direction. First and second outer electrodes 5a and 5b are provided on the first and second end surfaces 2c and 2d. The first detecting electrode 4a is electrically connected to the first outer electrode 5a. The second detecting electrode 4b is electrically connected to the second outer electrode 5b.

The polarization axis of the piezoelectric body 2 is parallel or substantially parallel to the lengthwise direction. More specifically, the piezoelectric body 2 has the polarization direction which is a direction X1 that is parallel or substantially parallel to the lengthwise direction and that goes from the second end surface 2d to the first end surface 2c in the piezoelectric body 2. The polarization direction may be a direction that extends from the first end surface 2c to the second end surface 2d.

Figure 3A:
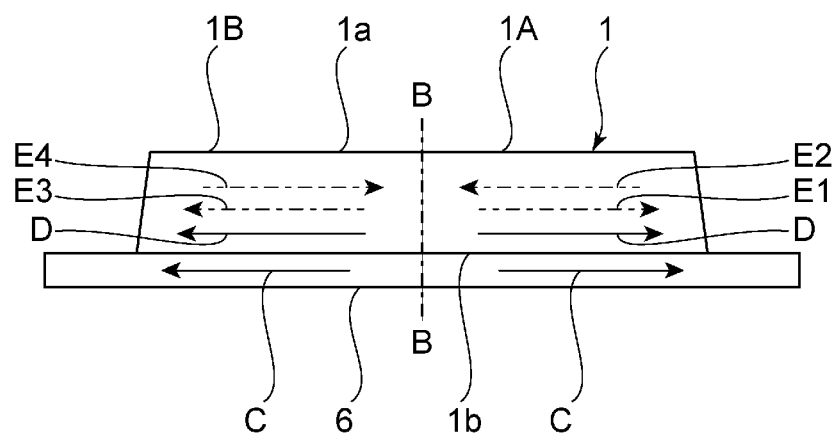
FIGS. 3A and 3B are schematic front views illustrating a mechanism of detecting distortion of a substrate that serves as an exemplary test object, by using the piezoelectric sensor according to the first preferred embodiment of the present invention.
Figure 3B:
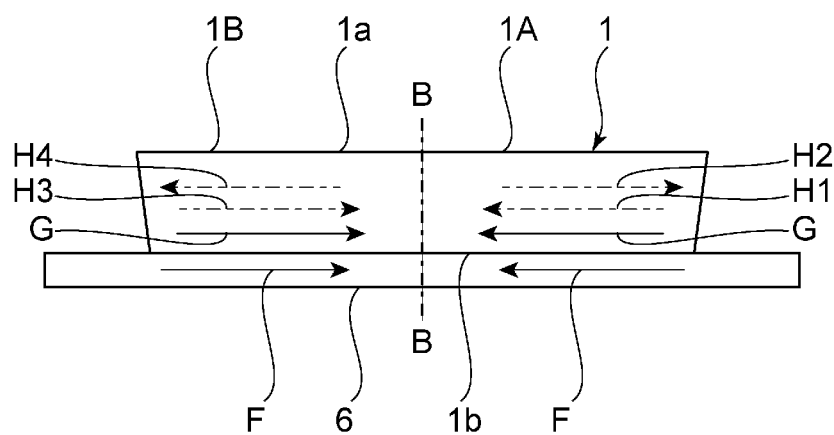

FIGS. 3A and 3B are schematic front views illustrating a mechanism of detecting distortion of a substrate that serves as an exemplary test object, by using the piezoelectric sensor according to the first preferred embodiment. The outer electrodes are not illustrated.

The piezoelectric sensor 1 includes first and second portions 1A and 1B. The first and second portions 1A and 1B abut against each other along line B-B positioned at the center in the lengthwise direction of the piezoelectric sensor 1, and face each other. As illustrated by arrows C in FIG. 3A, when a substrate 6 is extended in the planar direction, tensile stress illustrated by arrows D is applied to a second principal surface 1b of the piezoelectric sensor 1. In contrast, stress is not applied to a first principal surface 1a. Therefore, shear stress illustrated by arrows E1 and E2 is applied to the piezoelectric body in the first portion 1A of the piezoelectric sensor 1. In addition, shear stress illustrated by arrows E3 and E4 is applied to the piezoelectric body in the second portion 1B. Based on this stress, electric signals are output due to the piezoelectric effect from both of the principal surfaces of the piezoelectric body. The piezoelectric body in the first portion 1A and that in the second portion 1B have the same polarization direction and shear stresses applied in the opposite directions. Therefore, the directions of the electric signals, each of which is output between the principal surfaces, are opposite to each other. Electric output produced at the third electrode 4c based on the first detecting electrode 4a of the piezoelectric body 2 illustrated in FIG. 2 has the same polarity as that produced at the second detecting electrode 4b based on the third electrode 4c. An electric signal is output between the first detecting electrode 4a and the second detecting electrode 4b by using the third electrode 4c as a relay electrode. The voltage of the electric signal is doubled by adding that in the first portion 1A to that in the second portion 1B illustrated in FIG. 3A. Thus, distortion of the substrate 6 is able to be detected with high sensitivity.

As illustrated by arrows F in FIG. 3B, also when the substrate 6 contracts in the planar direction, compressive stress illustrated by arrows G is applied to the second principal surface 1b of the piezoelectric sensor 1, and shear stress H1 to H4 is applied to the piezoelectric body of the piezoelectric sensor 1. In this case, as in the case illustrated in FIG. 3A, distortion of the substrate 6 may be detected. In the present preferred embodiment, the substrate 6 is preferably used as a detection object, but the detection object is not limited to a substrate.

In a piezoelectric sensor of the related art in which the polarization axis of a piezoelectric body matches the thickness direction of the piezoelectric body, first and second detecting electrodes are positioned to face each other in the polarization axis direction. Therefore, noise caused by the pyroelectric effect is also detected. Accordingly, accuracy in detection of distortion of a detection object fails to be fully improved. Therefore, a correction circuit to correct the noise may be necessary.

In contrast, as illustrated in FIG. 2, in the piezoelectric sensor 1 according to the first preferred embodiment, the first and second detecting electrodes 4a and 4b face each other on the second principal surface 2b. The polarization axis direction of the piezoelectric body 2 is parallel or substantially parallel to the lengthwise direction. Therefore, the first and second detecting electrodes 4a and 4b do not face each other in the polarization axis direction. Accordingly, occurrence of charge on a surface of the piezoelectric body 2 due to the pyroelectric effect hardly provides a potential difference between the first detecting electrode 4a and the second detecting electrode 4b. This enables noise produced due to the pyroelectric effect to be hardly produced. Accordingly, a correction circuit is not necessary, and accuracy in detection of distortion of a detection object may be much more improved.

FIGS. 3A and 3B illustrate detection of extension and contraction in the planar direction of the substrate 6. The piezoelectric sensor 1 may detect bending or distortion of the substrate 6. For example, when a substrate bends, tensile or compressive stress caused by extension or contraction on a surface of the substrate is applied to the piezoelectric sensor 1. Stress applied in the lengthwise direction of the piezoelectric body on the first principal surface of the piezoelectric body is different from that on the second principal surface. Therefore, electric output corresponding to the shear stress may be obtained.

A direction perpendicular or substantially perpendicular to the lengthwise direction is referred to as the width direction. The piezoelectric sensor 1 detects distortion of a detection object in a direction parallel or substantially parallel to the lengthwise direction of the piezoelectric body, and does not detect distortion of the detection object in a direction parallel or substantially parallel to the thickness direction or the width direction of the piezoelectric body. That is, the piezoelectric sensor 1 has anisotropy along the detecting axis. Therefore, use of the piezoelectric sensor 1 enables detection of distortion of a detection object only in a direction in which detection is to be performed.

Figure 4:
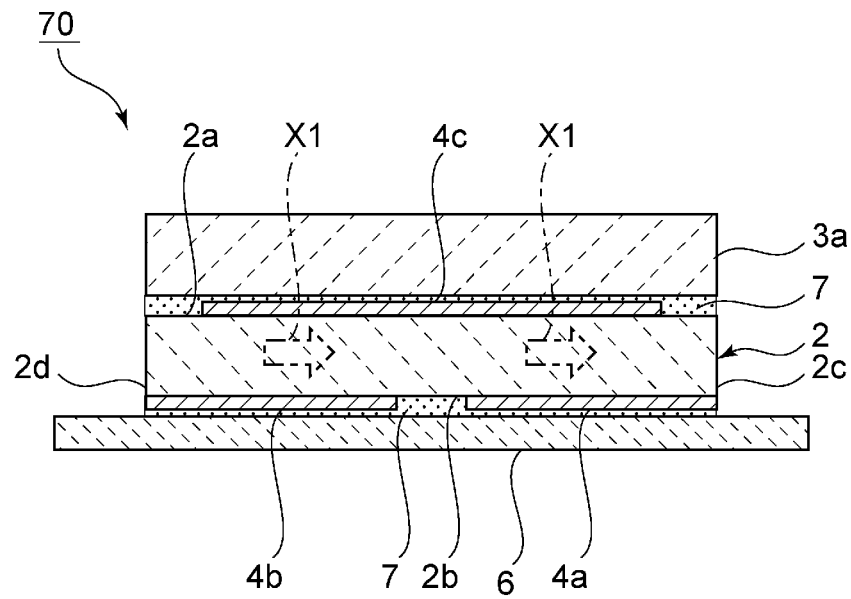
FIG. 4 is a front sectional view of a first modified example of the piezoelectric sensor according to the first preferred embodiment of the present invention, which is fixed to a substrate that is a test object.
Figure 5:
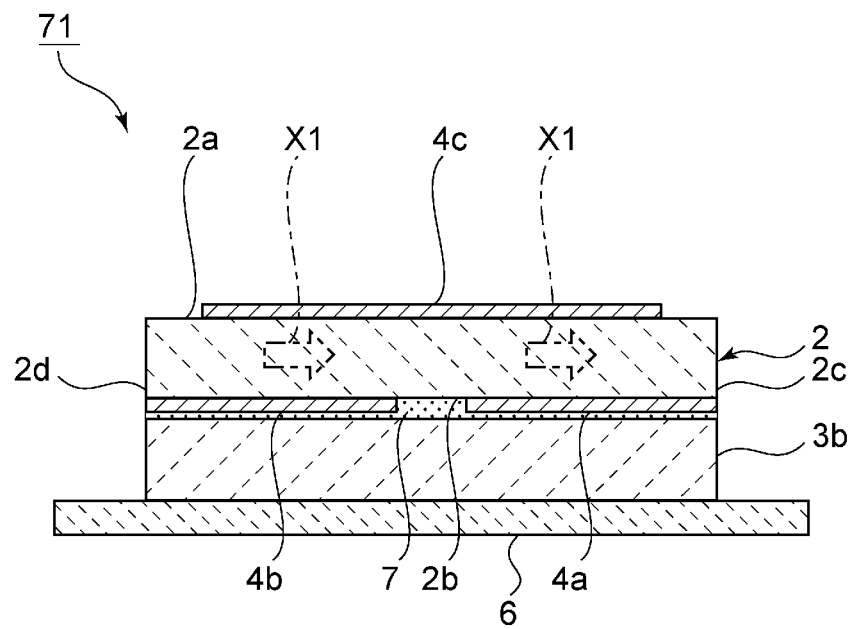
FIG. 5 is a front sectional view of a second modified example of the piezoelectric sensor according to the first preferred embodiment of the present invention, which is fixed to a substrate that is a test object.

FIG. 4 illustrates a first modified example of the first preferred embodiment, which is fixed to a substrate that is a test object. As in a piezoelectric sensor 70, only the first principal surface 2a of the piezoelectric body 2 may be connected to the first outer body 3a. As in a piezoelectric sensor 71 which is a second modified example illustrated in FIG. 5, only the second principal surface 2b of the piezoelectric body 2 may be connected to the second outer body 3b.

Figure 6:
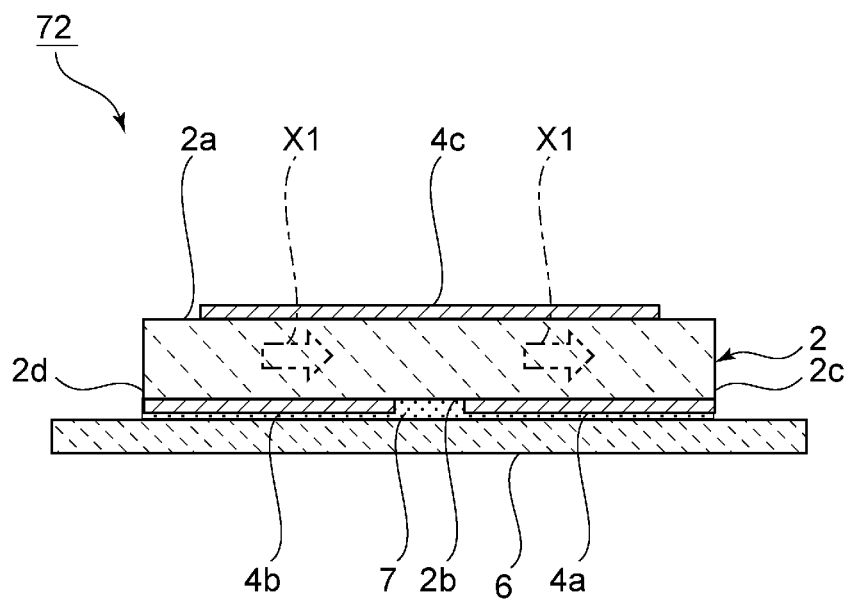
FIG. 6 is a front sectional view of a third modified example of the piezoelectric sensor according to the first preferred embodiment of the present invention, which is fixed to a substrate that is a test object.

As in a third modified example illustrated in FIG. 6, a piezoelectric sensor 72 may include neither the first outer body nor the second outer body. This causes the number of components to be reduced. However, it is preferable to include the first and second outer bodies 3a and 3b, as in the first preferred embodiment illustrated in FIG. 2. This causes the strength of the piezoelectric sensor 1 to be improved.

Figure 7:
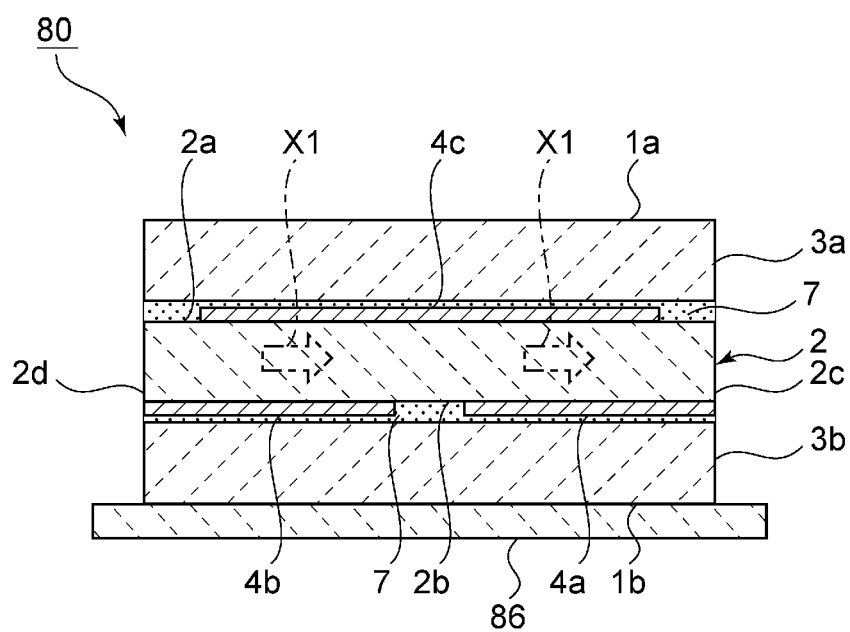
FIG. 7 is a front sectional view of a fourth modified example of the piezoelectric sensor according to the first preferred embodiment of the present invention.

As in a fourth modified example illustrated in FIG. 7, a piezoelectric sensor 80 may include a mounting substrate 86. More specifically, the multilayer body including the piezoelectric body 2 and the first and second outer bodies 3a and 3b may be mounted on the mounting substrate 86. The piezoelectric body 2 to which the first and second outer bodies 3a and 3b are not connected may be connected to the mounting substrate 86. Alternatively, a multilayer body including the first outer body 3a and the piezoelectric body 2 may be connected to the mounting substrate 86 on the first outer body 3a side or the piezoelectric body 2 side. A material of the mounting substrate 86 is not particularly limited. However, a glass epoxy substrate is preferably used.

In the fourth modified example, the multilayer body including the piezoelectric body 2 and the first and second outer bodies 3a and 3b is fixed to a test object with the mounting substrate 86 interposed in between. This enables the strength of the piezoelectric sensor 80 to be improved. However, the piezoelectric body 2 is more easily distorted in the structure illustrated in FIG. 2, in which the piezoelectric body 2 is fixed to a test object without the mounting substrate 86 interposed in between. The preferred embodiment illustrated in FIG. 2 achieves more improved detection sensitivity.

Figure 8:
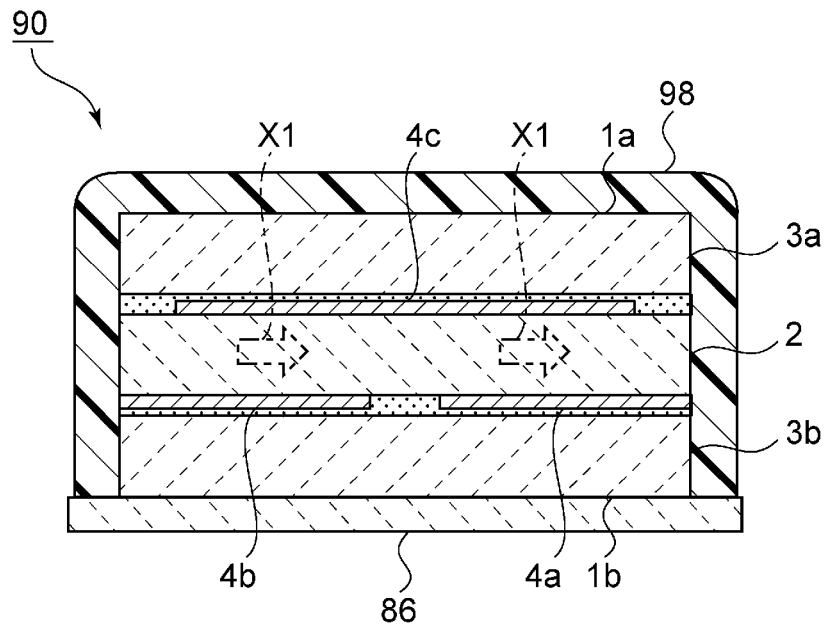
FIG. 8 is a front sectional view of a fifth modified example of the piezoelectric sensor according to the first preferred embodiment of the present invention.

As in a piezoelectric sensor 90 which is a fifth modified example illustrated in FIG. 8, a resin mold layer 98 may be provided on the mounting substrate 86. Provision of the resin mold layer 98 enables the strength of the piezoelectric sensor 90 to be much further improved. However, the preferred embodiment illustrated in FIG. 2 achieves more improved detection sensitivity.

Figure 9:
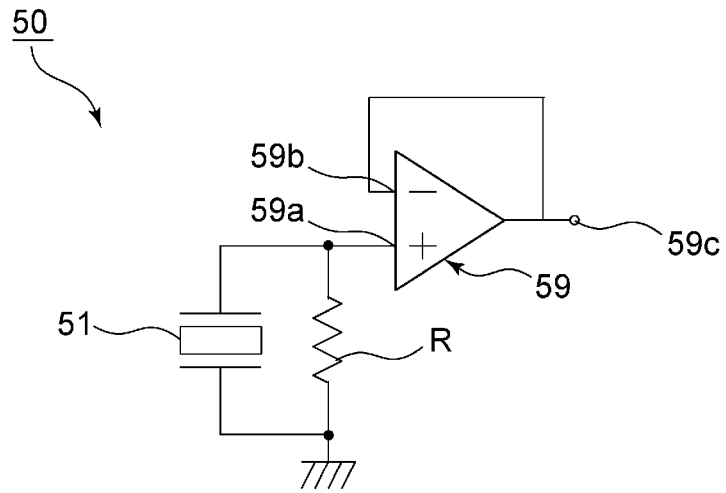
FIG. 9 is a circuit diagram of a detecting device according to a second preferred embodiment of the present invention.

FIG. 9 is a circuit diagram of a detecting device according to a second preferred embodiment of the present invention.

A detecting device 50 includes a sensor circuit. The sensor circuit includes an operational amplifier 59. The operational amplifier 59 includes first and second input ends 59a and 59b and an output end 59c. A piezoelectric sensor 51 is connected between the first input end 59a and ground potential. A resistor R is connected in parallel with the piezoelectric sensor 51. The second input end 59b is connected to the output end 59c. In the detecting device 50, output from the piezoelectric sensor 51 is amplified by the operational amplifier 59, and the amplified output is obtained from the output end 59c.

In the sensor circuit in the detecting device 50, the larger the electrostatic capacitance in the piezoelectric sensor 51 is, the lower the cutoff frequency of the detecting device 50 is. Therefore, use of the piezoelectric sensor 51 having a larger electrostatic capacitance enables a signal with a much lower frequency bandwidth to be detected. Therefore, distortion at a low rate may be detected.

The detecting device 50 does not need a correction circuit. The sensor circuit in the detecting device 50 includes the piezoelectric sensor 51, the resistor R, and the operational amplifier 59. Therefore, the number of components in the detecting device 50 may be reduced.

Figure 10:
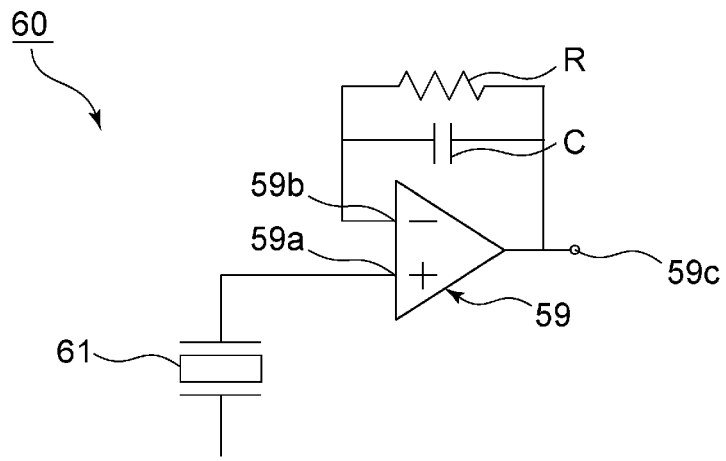
FIG. 10 is a circuit diagram of a detecting device according to a third preferred embodiment of the present invention.

FIG. 10 is a circuit diagram of a detecting device according to a third preferred embodiment of the present invention.

In a sensor circuit in a detecting device 60, a piezoelectric sensor 61 is connected between the first input end 59a of the operational amplifier 59 and ground potential. A capacitor C and the resistor R are connected in parallel with each other between the second input end 59b and the output end 59c.

In the sensor circuit in the detecting device 60, the cutoff frequency on the lower range side is not affected by the electrostatic capacitance and the insulation resistance of the piezoelectric sensor 61. Therefore, a signal with a much lower frequency bandwidth may be detected. Therefore, distortion at a much lower rate may be detected.

Figure 11:
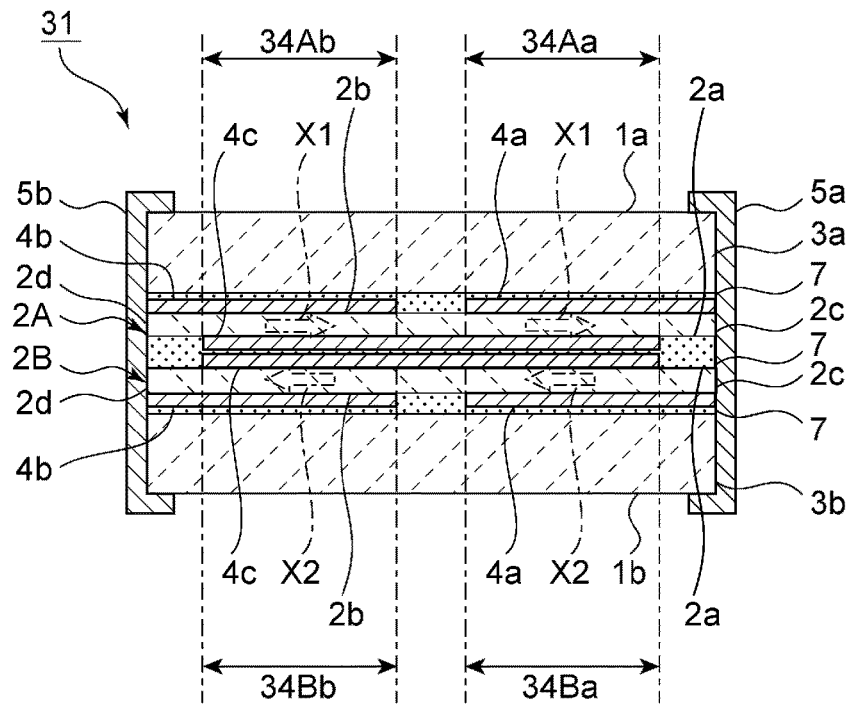
FIG. 11 is a front sectional view of a piezoelectric sensor according to a fourth preferred embodiment of the present invention.

FIG. 11 is a front sectional view of a piezoelectric sensor according to a fourth preferred embodiment of the present invention.

A piezoelectric sensor 31 includes first and second piezoelectric bodies 2A and 2B. The first piezoelectric body 2A has a configuration similar to that of the piezoelectric body 2 according to the preferred embodiment illustrated in FIG. 2. The second piezoelectric body 2B illustrated in FIG. 11 has a configuration similar to that in the first piezoelectric body 2A except that the second piezoelectric body 2B is polarized in a direction X2 that is opposite to that in the first piezoelectric body 2A.

The first principal surface 2a of the first piezoelectric body 2A is connected to the first principal surface 2a of the second piezoelectric body 2B with an adhesive 7 interposed in between. The first piezoelectric body 2A is positioned on the first principal surface 1a side of the piezoelectric sensor 31, and the second piezoelectric body 2B is positioned on the second principal surface 1b side of the piezoelectric sensor 31. Each of the first piezoelectric body 2A and the second piezoelectric body 2B may be disposed upside down, and the second principal surface 2b of the first piezoelectric body 2A may be connected to the second principal surface 2b of the second piezoelectric body 2B with the adhesive 7 interposed in between.

As described above, the polarization axis directions of the first and second piezoelectric bodies 2A and 2B are opposite to each other in the lengthwise direction. Therefore, the polarity of charge produced due to the pyroelectric effect in the first piezoelectric body 2A is opposite to that in the second piezoelectric body 2B. Consequently, most of the charge produced due to the pyroelectric effect may be canceled. Therefore, accuracy in detection of distortion of a detection object may be much further improved.

The piezoelectric sensor 31 may be used, for example, as the piezoelectric sensor 51 in the detecting device 50 illustrated in FIG. 9. As illustrated in FIG. 11, the first and second detecting electrodes 4a and 4b of the piezoelectric sensor 31 are provided with facing portions 34Aa and 34Ab in which the first and second detecting electrodes 4a and 4b face the third electrode 4c in the thickness direction of the first piezoelectric body 2A. The first and second detecting electrodes 4a and 4b are provided with facing portions 34Ba and 34Bb in which the first and second detecting electrodes 4a and 4b face the third electrode 4c in the thickness direction of the second piezoelectric body 2B.

The facing portions 34Aa and 34Ba and the facing portions 34Ab and 34Bb, each of which has an electrostatic capacitance, are laminated. Therefore, the electrostatic capacitance of the piezoelectric sensor 31 is increased much more significantly. Consequently, a signal with a much lower frequency bandwidth may be detected. Therefore, distortion at a much lower rate may be detected.

In the piezoelectric sensor 31, multiple sets of the first and second piezoelectric bodies 2A and 2B may be laminated. In this case, as long as the first principal surfaces 2a of the first piezoelectric body 2A and the second piezoelectric body 2B, or the second principal surfaces 2b of the first piezoelectric body 2A and the second piezoelectric body 2B are connected to each other, any configuration may be used. This achieves not only canceling of most of charge produced due to the pyroelectric effect, but also a much more effective increase in the electrostatic capacitance. Therefore, distortion at a much lower rate may be detected.

Figure 12:
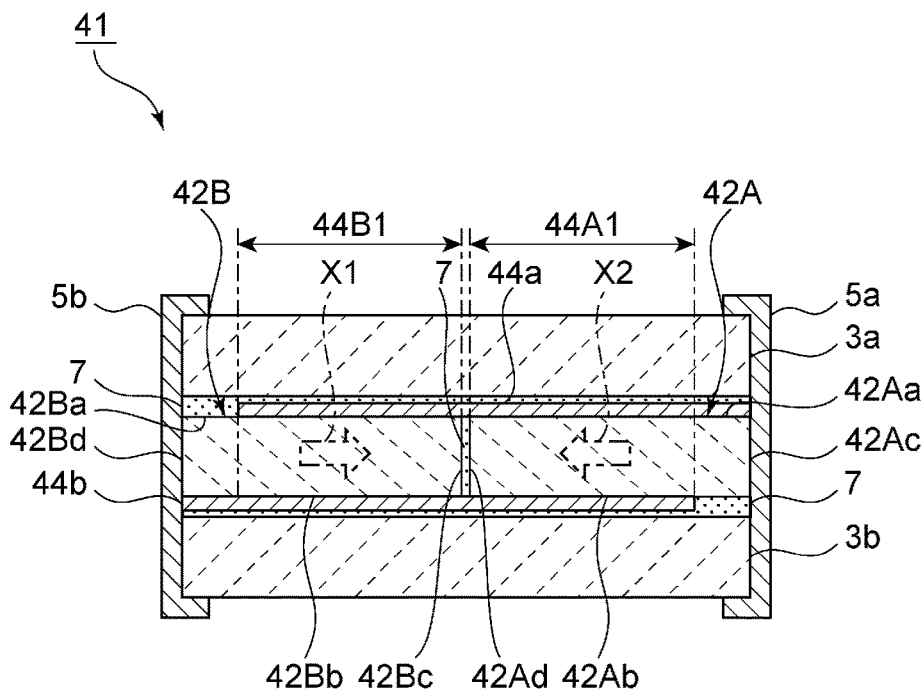
FIG. 12 is a front sectional view of a piezoelectric sensor according to a fifth preferred embodiment of the present invention.

FIG. 12 is a front sectional view of a piezoelectric sensor according to a fifth preferred embodiment of the present invention.

A piezoelectric sensor 41 includes first and second piezoelectric bodies 42A and 42B extending in the lengthwise direction. The first piezoelectric body 42A includes first and second principal surfaces 42Aa and 42Ab and first and second end surfaces 42Ac and 42Ad that face each other in the lengthwise direction. The second piezoelectric body 42B includes first and second principal surfaces 42Ba and 42Bb and first and second end surfaces 42Bc and 42Bd that face each other in the lengthwise direction. The second end surface 42Ad of the first piezoelectric body 42A is connected to the first end surface 42Bc of the second piezoelectric body 42B with an adhesive 7 interposed in between.

The first piezoelectric body 42A and the second piezoelectric body 42B are polarized in the opposite lengthwise directions. More specifically, the first piezoelectric body 42A is polarized in the direction X2 that is parallel or substantially parallel to the lengthwise direction and that goes from the first end surface 42Ac of the first piezoelectric body 42A to the second end surface 42Ad. The second piezoelectric body 42B is polarized in the direction X1 which is opposite to the direction X2.

A first detecting electrode 44a is provided on the first principal surfaces 42Aa and 42Ba of the first and second piezoelectric bodies 42A and 42B. The first detecting electrode 44a extends on the first principal surface 42Aa of the first piezoelectric body 42A and further extends on the first principal surface 42Ba of the second piezoelectric body 42B. A second detecting electrode 44b is provided on the second principal surfaces 42Ab and 42Bb of the first and second piezoelectric bodies 42A and 42B. The second detecting electrode 44b extends on the second principal surface 42Bb of the second piezoelectric body 42B and further extends on the second principal surface 42Ab of the first piezoelectric body 42A.

The first outer electrode 5a is provided on the first end surface 42Ac of the first piezoelectric body 42A. The second outer electrode 5b is provided on the second end surface 42Bd of the second piezoelectric body 42B. The first detecting electrode 44a is electrically connected to the first outer electrode 5a. The second detecting electrode 44b is electrically connected to the second outer electrode 5b.

The first detecting electrode 44a does not face the second detecting electrode 44b in the polarization axis direction. Therefore, noise produced due to the pyroelectric effect between the first detecting electrode 44a and the second detecting electrode 44b is effectively reduced. The first and second piezoelectric bodies 42A and 42B have polarization directions opposite to each other, and are disposed with the adhesive 7 interposed in between. Therefore, pyroelectric noise produced between the outer electrodes 5a and 5b which face each other and which are disposed on the first end surface 42Ac and the second end surface 42Bd is effectively reduced.

The first detecting electrode 44a and the second detecting electrode 44b are provided with a facing portion 44A1 in which the first detecting electrode 44a faces the second detecting electrode 44b in the thickness direction of the first piezoelectric body 42A, and a facing portion 44B1 in which the first detecting electrode 44a faces the second detecting electrode 44b in the thickness direction of the second piezoelectric body 42B. The facing portion 44A1 and the facing portion 44B1 are connected to each other in such a manner as to be parallel with each other. Therefore, a much larger electrostatic capacitance may be achieved. Accordingly, use of the piezoelectric sensor 41 in the detecting device according to the third preferred embodiment enables a signal with a much lower frequency bandwidth to be detected. Therefore, distortion at a much lower rate may be detected.

In the piezoelectric sensor 41, multiple sets of the first piezoelectric body 42A and the second piezoelectric body 42B may be laminated in the thickness direction. This enables the electrostatic capacitance to be more effectively increased. Therefore, distortion at a much lower rate is able to be detected.

Figure 13:
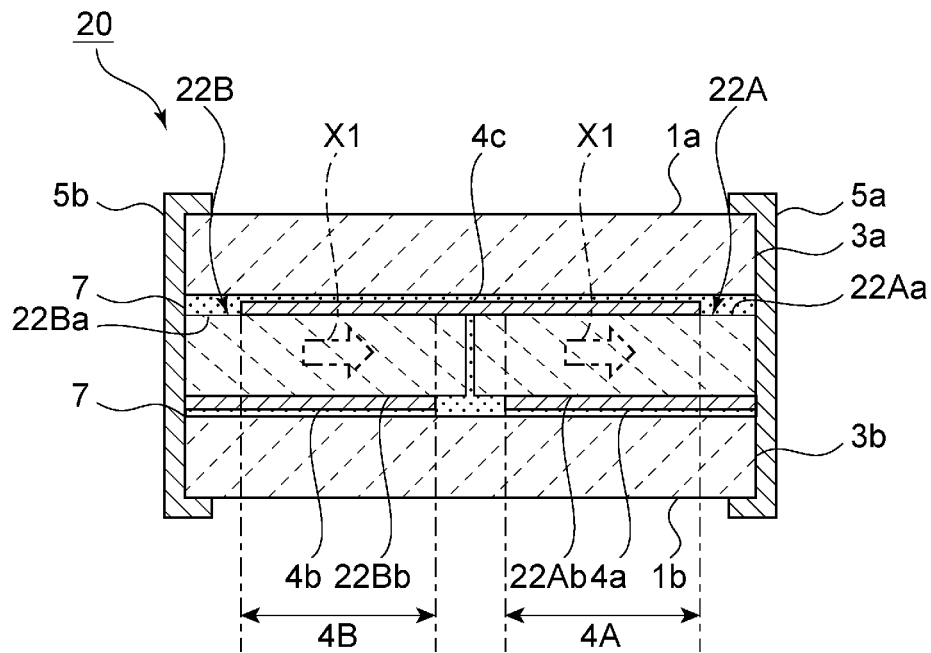
FIG. 13 is a front sectional view of a sixth modified example of the piezoelectric sensor according to the first preferred embodiment of the present invention.

FIG. 13 is a front sectional view of a sixth modified example of the piezoelectric sensor according to the first preferred embodiment.

Like the fifth preferred embodiment, a piezoelectric sensor 20 may include first and second piezoelectric bodies 22A and 22B whose end surfaces are connected to each other with an adhesive 7 interposed in between. The first and second piezoelectric bodies 22A and 22B are different from the first and second piezoelectric bodies 42A and 42B according to the fifth preferred embodiment illustrated in FIG. 12 in that the first and second piezoelectric bodies 22A and 22B have the same polarization direction. The first detecting electrode 4a is provided on a second principal surface 22Ab of the first piezoelectric body 22A. The second detecting electrode 4b is provided on a second principal surface 22Bb of the second piezoelectric body 22B. The third electrode 4c extends on a first principal surface 22Aa of the first piezoelectric body 22A and further extends on a first principal surface 22Ba of the second piezoelectric body 22B. This achieves suppression of occurrence of charge produced in the polarization direction between the first detecting electrode 4a and the second detecting electrode 4b or between the first outer electrode 5a and the second outer electrode 5b, and also achieves reduction in pyroelectric noise.

Figure 14:
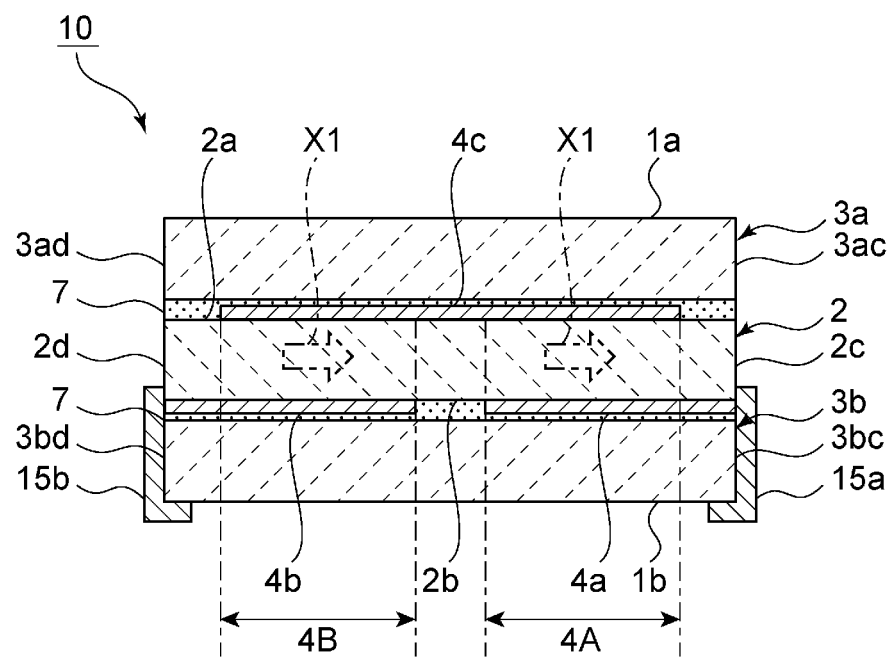
FIG. 14 is a front sectional view of a seventh modified example of the piezoelectric sensor according to the first preferred embodiment of the present invention.

As in a seventh modified example illustrated in FIG. 14, first and second outer electrodes 15a and 15b of a piezoelectric sensor 10 may extend on first and second end surfaces 3bc and 3bd of the second outer body 3b and further extend on the first and second end surfaces 2c and 2d of the piezoelectric body 2. It is desirable to provide the first and second outer electrodes 15a and 15b only near end portions on the second principal surface 2b side on the first and second end surfaces 2c and 2d of the piezoelectric body 2. This achieves reduction in the area of portions in which the electrodes face each other and which are positioned at the ends in the polarization direction, causing pyroelectric noise to be effectively reduced.

Figure 15:
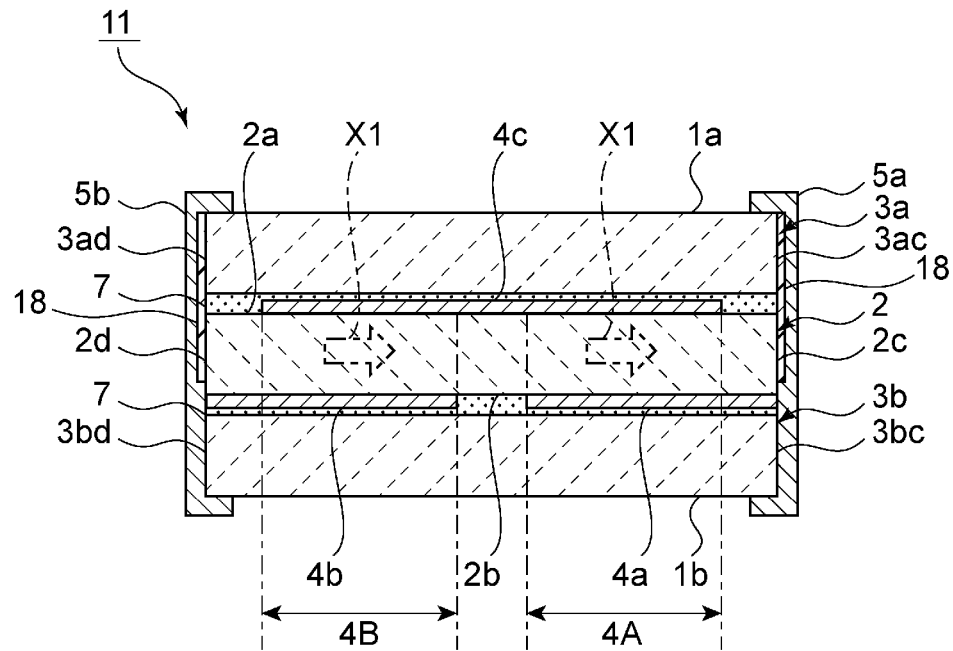
FIG. 15 is a front sectional view of an eighth modified example of the piezoelectric sensor according to the first preferred embodiment of the present invention.

As in an eighth modified example illustrated in FIG. 15, a piezoelectric sensor 11 may include insulating layers 18. The insulating layers 18 extend on first and second end surfaces 3ac and 3ad of the first outer body 3a and further extend on the first and second end surfaces 2c and 2d of the piezoelectric body 2 and so as not to extend to the first and second detecting electrodes 4a and 4b. In this case, the first and second outer electrodes 5a and 5b are provided on the end surfaces 3bc and 3bd of the second outer body 3b, portions which are positioned on the first and second end surfaces 2c and 2d of the piezoelectric body 2 and in which the insulating layers 18 are not disposed, and the insulating layers 18. The eighth modified example also achieves reduction in the area of portions in which the electrodes face each other and which are positioned at the ends in the polarization direction, causing pyroelectric noise to be effectively reduced.

Figure 16:
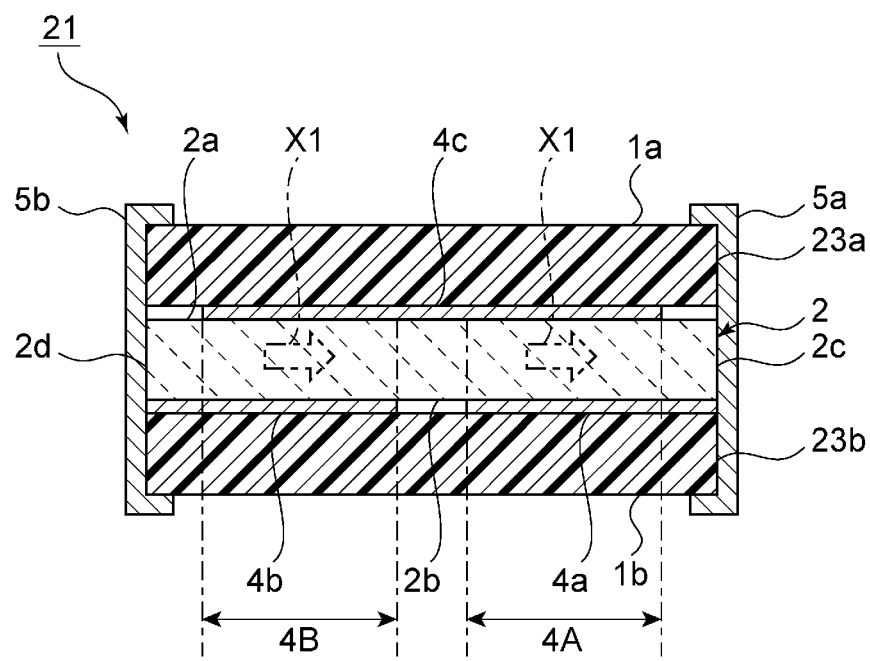
FIG. 16 is a front sectional view of a ninth modified example of the piezoelectric sensor according to the first preferred embodiment of the present invention.

As in a ninth modified example illustrated in FIG. 16, the adhesives 7 may be omitted, for example, in the case where first and second outer bodies 23a and 23b of a piezoelectric sensor 21 are formed of an adhesive resin.

Figure 17:
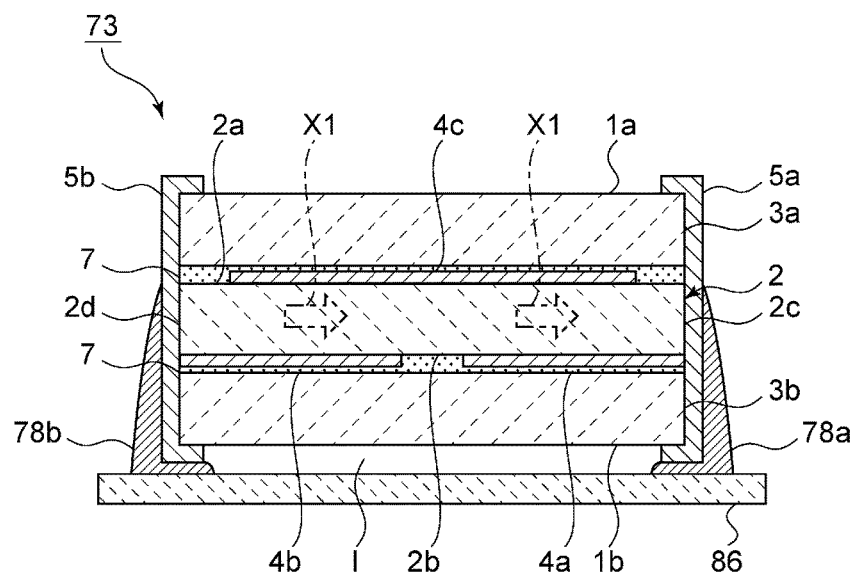
FIG. 17 is a front sectional view of a tenth modified example of the piezoelectric sensor according to the first preferred embodiment of the present invention, which is fixed to a substrate that is a test object.

As in a tenth modified example illustrated in FIG. 17, a piezoelectric sensor 73 may be mounted on the mounting substrate with brazing materials 78a and 78b that are interposed in between and that are formed of solder or the like. More specifically, the piezoelectric sensor 73 is connected to the mounting substrate 86 at two portions of the first and second outer electrodes 5a and 5b by using the brazing materials 78a and 78b. In plan view, the mounting substrate 86 has dimensions in the lengthwise direction and the width direction which are larger than those of the piezoelectric sensor 73 (not illustrated). Therefore, the mounting substrate 86 is easily bent. Accordingly, the piezoelectric body 2 may be easily distorted. Consequently, detection sensitivity for distortion of a test object is effectively improved.

In the piezoelectric sensor 73, a gap I is provided between the mounting substrate 86 and the second outer body 3b. This makes noise, such as a shock and a vibration from the outside, difficult to detect. Therefore, detection sensitivity for distortion of a test object is much more effectively improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric sensor fixed to a detection object and detecting distortion of the detection object, the piezoelectric sensor comprising:
   a piezoelectric body that includes first and second principal surfaces and that extends in a lengthwise direction, a polarization axis direction of the piezoelectric body being parallel or substantially parallel to the lengthwise direction;
   first and second detecting electrodes that are provided on a surface of the piezoelectric body and that extend in a direction parallel or substantially parallel to the lengthwise direction; and
   a third electrode that is not connected to outside; wherein
   the distortion of the detection object is detected based on electric output corresponding to shear stress applied to the piezoelectric body;
   the third electrode is provided on the first principal surface of the piezoelectric body; and
   the first and second detecting electrodes are provided on the second principal surface of the piezoelectric body to face each other with a gap interposed therebetween, and are provided with facing portions in which the first and second detecting electrodes face the third electrode in a thickness direction of the piezoelectric body.

2. A detecting device comprising:
   a sensor circuit that includes an operational amplifier including first and second input ends and an output end; and
   the piezoelectric sensor according to claim 1; wherein
   the piezoelectric sensor is connected to the first input end of the operational amplifier.

3. The piezoelectric sensor according to claim 1, wherein
   the piezoelectric sensor includes first and second piezoelectric bodies defining the piezoelectric body;
   each of the first and second piezoelectric bodies includes the first and second principal surfaces and extends in the lengthwise direction;
   the first and second detecting electrodes are provided on the second principal surface of each of the first and second piezoelectric bodies so as to face each other with the gap interposed therebetween;
   the third electrode is provided on the first principal surfaces of the first and second piezoelectric bodies, respectively,
   the first piezoelectric body is connected to the second piezoelectric body such that the first principal surfaces or the second principal surfaces are connected to each other; and
   polarization axis directions of the first and second piezoelectric bodies match the lengthwise direction and are opposite to each other.

4. The piezoelectric sensor according to claim 1, wherein
   the piezoelectric sensor includes third and fourth piezoelectric bodies defining the piezoelectric body;
   each of the third and fourth piezoelectric bodies includes the first and second principal surfaces, extends in the lengthwise direction, and also includes first and second end surfaces that face each other in the lengthwise direction;
   the second end surface of the third piezoelectric body is connected to the first end surface of the fourth piezoelectric body;
   the first detecting electrode is provided on the first principal surfaces of the third and fourth piezoelectric bodies;
   the second detecting electrode is provided on the second principal surfaces of the third and fourth piezoelectric bodies;
   the piezoelectric sensor includes facing portions in which the first detecting electrode faces the second detecting electrode in a thickness direction of the third and fourth piezoelectric bodies; and
   polarization axis directions of the third and fourth piezoelectric bodies match the lengthwise direction and are opposite to each other.

5. The piezoelectric sensor according to claim 1, wherein a plate-shaped outer body is disposed on at least one of the first and second principal surfaces of the piezoelectric body.

6. The piezoelectric sensor according to claim 1, further comprising a mounting substrate connected to one of the first principal surface and the second principal surface of the piezoelectric body.

7. The piezoelectric sensor according to claim 5, further comprising a mounting substrate connected to the outer body.

8. The piezoelectric sensor according to claim 1, wherein
   the piezoelectric body includes first and second side surfaces;
   the first and second detecting electrodes and the third electrode do not reach the first and second side surfaces; and
   the first and second detecting electrodes and the third electrode are not exposed on the first and second side surfaces.

9. The piezoelectric sensor according to claim 1, further comprising:
   a mounting substrate; and
   a multilayer body including the piezoelectric body and first and second outer bodies fixed to the piezoelectric body; wherein
   the multilayer body is mounted on the mounting substrate.

10. The piezoelectric sensor according to claim 9, further comprising a resin mold layer provided on the mounting substrate.

11. The piezoelectric sensor according to claim 7, further comprising a resin mold layer provided on the mounting substrate.

12. The piezoelectric sensor according to claim 1, wherein the piezoelectric body is a first piezoelectric body and the piezoelectric sensor includes a second piezoelectric body with a same structure as the first piezoelectric body.

13. The piezoelectric sensor according to claim 12, wherein the first and second piezoelectric bodies are polarized in opposite directions.

14. The piezoelectric sensor according to claim 12, wherein the first and second piezoelectric bodies are polarized in a same direction.

15. The piezoelectric sensor according to claim 1, further comprising insulating layers on first and second end surfaces of the piezoelectric body.

16. A piezoelectric sensor fixed to a detection object and detecting distortion of the detection object, the piezoelectric sensor comprising:
   a piezoelectric body that includes first and second principal surfaces and that extends in a lengthwise direction, a polarization axis direction of the piezoelectric body being parallel or substantially parallel to the lengthwise direction;
   first and second detecting electrodes that are provided on a surface of the piezoelectric body and that extend in a direction parallel or substantially parallel to the lengthwise direction;
   a mounting substrate; and
   a multilayer body including the piezoelectric body and first and second outer bodies fixed to the piezoelectric body; wherein
   the distortion of the detection object is detected based on electric output corresponding to shear stress applied to the piezoelectric body;
   the multilayer body is mounted on the mounting substrate; and
   the first and second outer bodies are made of an adhesive resin.

17. The detecting device according to claim 2, further comprising a resistor connected to in parallel with the piezoelectric sensor.

18. The detecting device according to claim 2, wherein the detecting device does not contain a correction circuit.

19. The detecting device according to claim 2, further comprising a capacitor and a resistor connected in parallel with each other between the second input end the output end.

* * * * *